US009781367B2

(12) United States Patent
Ishii

(10) Patent No.: US 9,781,367 B2
(45) Date of Patent: Oct. 3, 2017

(54) IMAGE SENSOR AND IMAGE CAPTURING APPARATUS HAVING AN ARRANGEMENT OF PIXELS AND WELL CONTACTS

(71) Applicant: CANON KABUSHIKI KAISHA, Tokyo (JP)

(72) Inventor: Mie Ishii, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/082,457

(22) Filed: Mar. 28, 2016

(65) Prior Publication Data
US 2016/0295139 A1 Oct. 6, 2016

(30) Foreign Application Priority Data
Apr. 2, 2015 (JP) ................................ 2015-076311

(51) Int. Cl.
*H04N 5/369* (2011.01)
*H04N 5/361* (2011.01)
*H01L 27/146* (2006.01)

(52) U.S. Cl.
CPC ..... *H04N 5/3696* (2013.01); *H01L 27/14605* (2013.01); *H01L 27/14607* (2013.01); *H01L 27/14612* (2013.01); *H01L 27/14643* (2013.01); *H04N 5/361* (2013.01)

(58) Field of Classification Search
CPC .............. H04N 5/3696; H04N 5/361; H01L 27/14643; H01L 27/14607; H01L 27/14612; H01L 27/14605
See application file for complete search history.

(56) References Cited

U.S. PATENT DOCUMENTS

| 2006/0186492 A1* | 8/2006 | Boettiger | H01L 27/14601 257/414 |
| 2011/0068253 A1* | 3/2011 | Arishima | H01L 27/14831 250/208.1 |
| 2015/0189140 A1* | 7/2015 | Sutton | H04N 5/2257 348/208.1 |
| 2017/0013211 A1* | 1/2017 | Kato | H04N 5/357 |

FOREIGN PATENT DOCUMENTS

JP 2014-116380 A 6/2014

\* cited by examiner

*Primary Examiner* — Twyler Haskins
*Assistant Examiner* — Angel L Garces-Rivera
(74) *Attorney, Agent, or Firm* — Carter, DeLuca, Farrell & Schmidt, LLP

(57) ABSTRACT

An image sensor includes an image sensing plane in which a plurality of pixels are two-dimensionally arranged and at least a portion of a region thereof has a curved shape, and a plurality of well contacts that fix a well potential and are connected to a portion of pixels from among the plurality of pixels. The well contacts are arranged such that an arrangement density thereof in the image sensing plane is different in each region according to the curved shape of the image sensing plane.

9 Claims, 6 Drawing Sheets

IMAGE SENSOR AND IMAGE CAPTURING APPARATUS HAVING AN ARRANGEMENT OF PIXELS AND WELL CONTACTS

BACKGROUND OF THE INVENTION

Field of the Invention

The present invention relates to an image sensor and an image capturing apparatus that uses the same.

Description of the Related Art

In recent years, image sensors such as CCD image sensors and CMOS image sensors have become widely used in single-lens reflex digital cameras and video cameras. Usually, an image sensor has a flat silicon substrate on which photodiodes (PD) or the like that perform photoelectric conversion are formed. Light that has passed through an imaging lens is received by the image sensor, and whereas light is perpendicularly incident on the image sensing plane of the image sensor in the central region of the image sensing plane, light is obliquely incident on the peripheral region of the image sensing plane. This results in the generation of a difference between the amounts of light that is incident on the pixels and shifting of the focal position due to lens aberration.

To address this, Japanese Patent Laid-Open No. 2014-116380 discloses a technique in which optical characteristics are enhanced by changing the configuration of the image sensor. Specifically, by curving the image sensor into a concave surface, a light shading correcting effect can be obtained and irregularity in the amount of light on the light receiving surface can be reduced. Also, a curvature of field correcting effect can also be obtained with a concave surface.

Incidentally, if tensile stress is applied when the image sensor is curved, the silicon energy band gap widens and dark current decreases. Due to this characteristic, a problem arises in that the amount of dark current in the image sensing plane is different between the region subjected to tensile stress and the region that is not subjected to tensile stress when the image sensor is curved. Also, even if the entire image sensing plane is subjected to tensile stress, the magnitude of the tensile stress changes depending on the region, and a difference in the amount of dark current similarly occurs in the image sensing plane. A difference in the amount of dark current in the image sensing plane is a cause of image quality deterioration when performing long-exposure image capture or capturing an image in a high-temperature environment, for example.

SUMMARY OF THE INVENTION

The present invention has been made in light of the above issues, and the present invention maximally suppresses dark current irregularity caused by differences in stress in an image sensing plane in cases such as when the image sensor is curved.

According to a first aspect of the present invention, there is provided an image sensor comprising: an image sensing plane in which a plurality of pixels are two-dimensionally arranged and at least a portion of a region thereof has a curved shape; and a plurality of well contacts that are connected to a portion of pixels from among the plurality of pixels and fix a well potential, wherein the plurality of well contacts are arranged such that an arrangement density thereof in the image sensing plane is different in each region.

According to a second aspect of the present invention, there is provided an image capturing apparatus comprising: an image sensor including: an image sensing plane in which a plurality of pixels are two-dimensionally arranged and at least a portion of a region thereof has a curved shape; and a plurality of well contacts that are connected to a portion of pixels from among the plurality of pixels and fix a well potential, wherein the plurality of well contacts are arranged such that an arrangement density thereof in the image sensing plane is different in each region.

Further features of the present invention will become apparent from the following description of exemplary embodiments with reference to the attached drawings.

DESCRIPTION OF THE EMBODIMENTS

Embodiments of the present invention will be described in detail below with reference to the attached drawings.

First Embodiment

Figure 1:
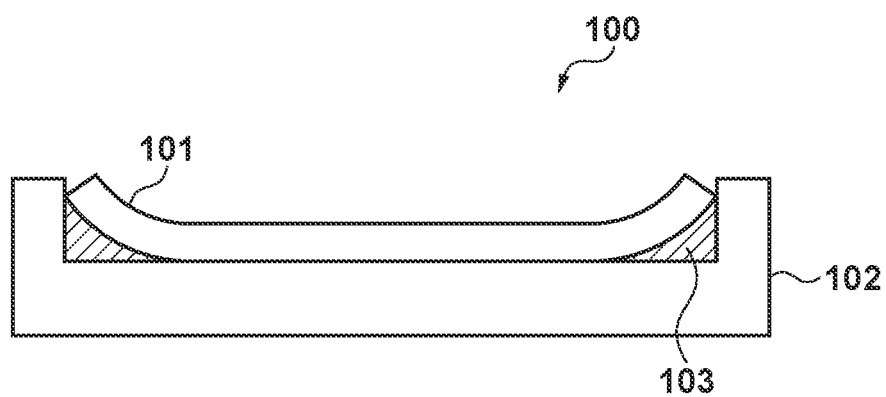
FIG. 1 is a schematic side cross-sectional diagram of an image sensor according to a first embodiment of the present invention.

FIG. 1 is a schematic side cross-sectional diagram of an image sensor according to a first embodiment of the present invention. An image sensor 100 is a CMOS image sensor, for example, in which an image sensor chip 101 that has an image sensing plane with a plurality of pixels that are two-dimensionally arranged thereon, is mounted onto a supporting substrate 102 that has a concave shape. As shown in FIG. 1, the image sensor chip 101 has a curved shape in which the peripheral region thereof has been raised. The space between the supporting substrate 102 and the image sensor chip 101 is filled with an adhesive layer 103, for example, that supports the image sensor chip 101 so as to maintain the curved shape thereof.

The image sensor 100 that has the image sensor chip 101 with a curved shape can be realized with known techniques other than the method of performing fixing by using the adhesive layer 103 as shown in FIG. 1. One example of a known technique is a method in which a curved shape is formed by forming an air hole in the supporting substrate 102 and using the air hole to discharge air and reduce the pressure between the image sensor chip 101 and the supporting substrate 102, thus applying stress to the image sensor chip 101. As shown in FIG. 1, due to the image sensor chip 101 having a curved shape with a raised peripheral region, even in the peripheral region of the image sensing plane, light that has passed through the imaging lens is incident on the pixels in a state in which the direction of the light is nearly perpendicular to the image sensing plane. Thus irregularity in the amount of light on the light receiving plane can be suppressed.

Figure 2:
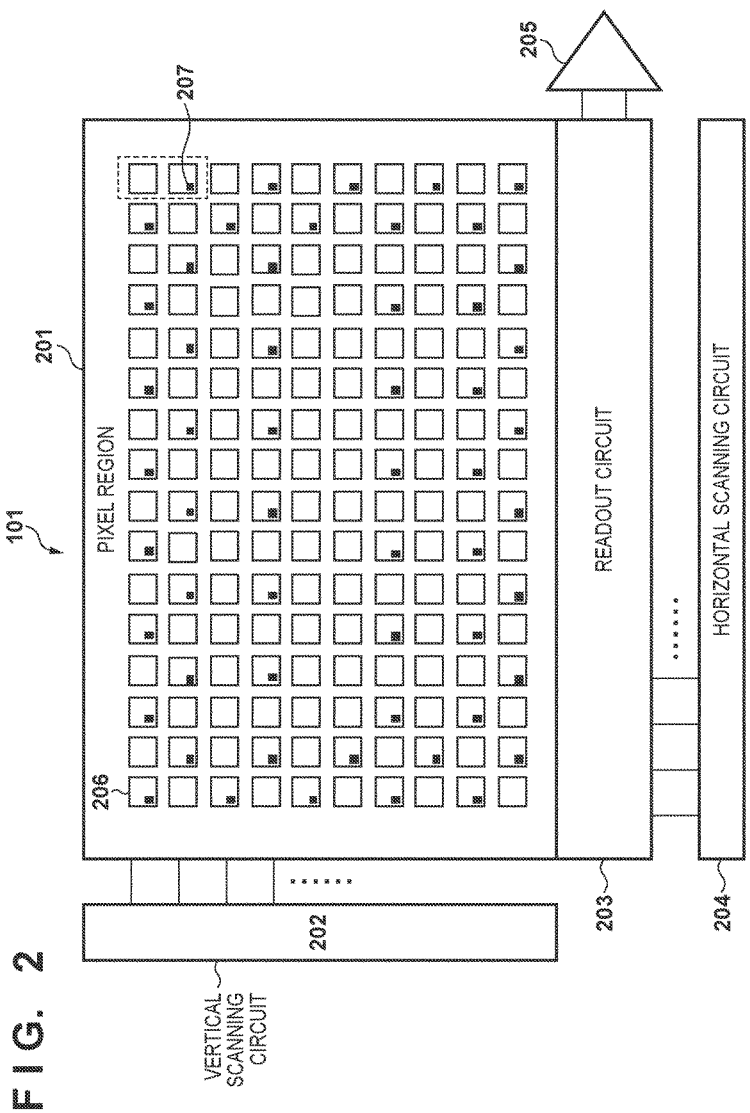
FIG. 2 is a block diagram showing an electrical configuration of the image sensor according to the first embodiment.

FIG. 2 is a block diagram showing an electrical configuration of the image sensor chip 101 shown in FIG. 1. The image sensor chip 101 has a pixel region 201, a vertical scanning circuit 202, a readout circuit 203, a horizontal scanning circuit 204, and an output amplifier 205. In the pixel region 201 formed in the image sensing plane, a plurality of unit pixels 206 are arranged in a matrix and perform photoelectric conversion on optical images formed by the imaging optical system. The vertical scanning circuit 202 selects and drives a row from which pixel signals are to be read out via signal lines that are connected to the rows in the pixel region 201. The signals from the pixels in the row selected by the vertical scanning circuit 202 are readout by the readout circuit 203. The horizontal scanning circuit 204 drives the readout circuit 203 via signal lines that are connected to the columns in the pixel region 201. Then, the pixel signals read out by the readout circuit 203 are successively output to the outside of the image sensor chip 101 via the output amplifier 205 due to driving by the horizontal scanning circuit 204.

Note that FIG. 2 shows a state in which the unit pixels 206 are arranged in 16 columns and 10 rows, but in an actual image sensor, several tens of millions of the unit pixels 206 are in a matrix. The unit pixels 206 are provided with red (R), green (G), and blue (B) color filters that are lined up according to a Bayer arrangement. Here, a portion of the pixels from among the arranged plurality of unit pixels 206 each have a well contact 207 arranged in the pixel. The well contact 207 is for supplying a reference potential to a well, and is connected to ground (GND) as an example of the reference potential. Note that there is a tendency for a large amount of dark current to be generated in pixels near the well contact.

Meanwhile, in the case where the image sensor chip 101 has a curved shape in which the peripheral region thereof has been raised as shown in FIG. 1, the stress in the curved portion in the peripheral region is increased, and therefore there is a tendency for the dark current in the curved portion to be lower than that of the flat portion with little stress in the central region. The difference in the amount of dark current leads to image quality deterioration.

In view of this, in the present embodiment, the well contacts 207 to be arranged in the pixel region 201 of the image sensor chip 101 are arranged such that the arrangement density thereof is different in each region according to the curved shape of the image sensor chip 101. Specifically, as shown in FIG. 2, the well contacts 207 are arranged with a high density in the curved peripheral region of the pixel region 201, and the well contacts 207 are arranged with a low density compared to that of the peripheral region in the flat portion corresponding to the central region. By employing such an arrangement, it is possible to suppress dark current irregularity in the image sensing plane of the image sensor that has a curved shape.

Figure 3:
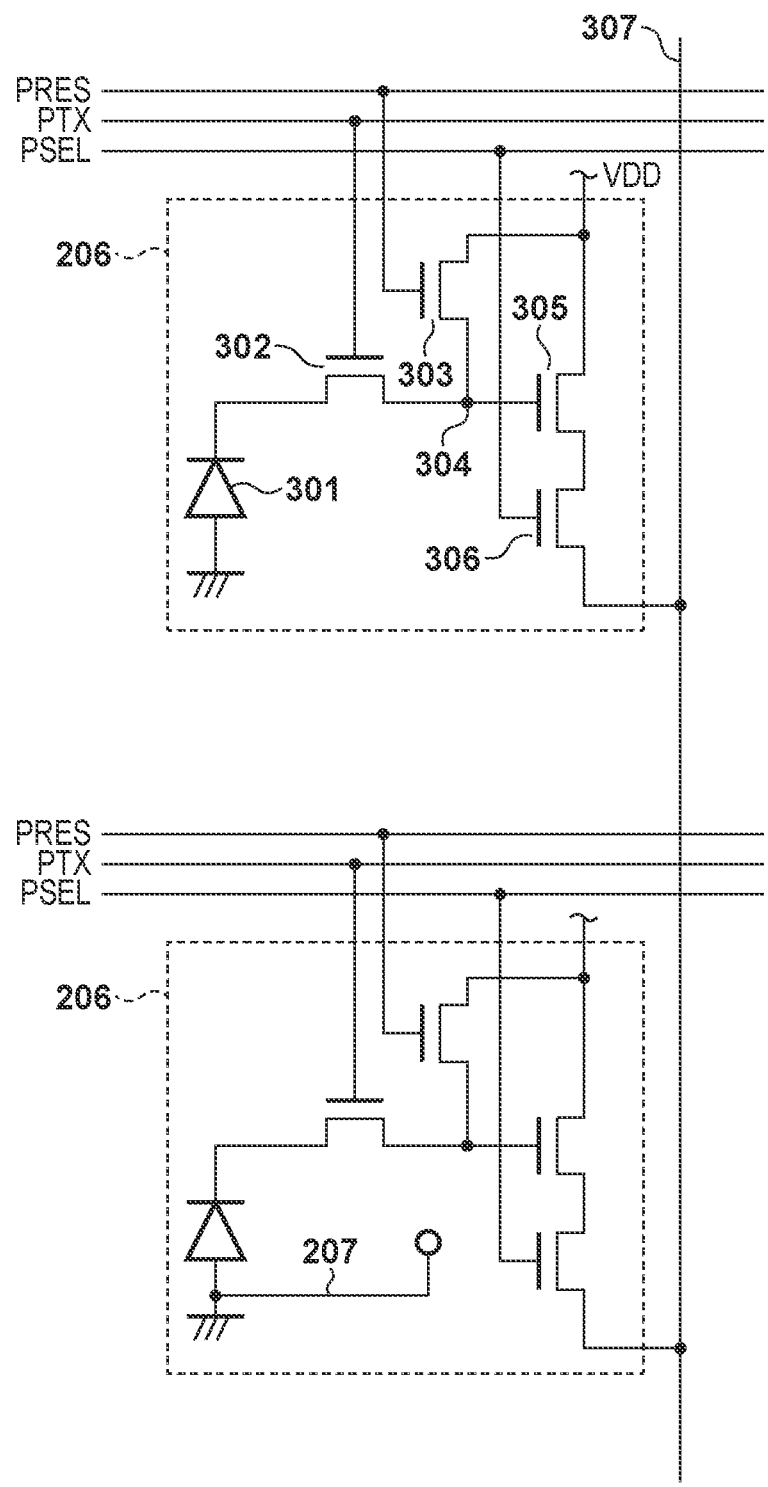
FIG. 3 is an equivalent circuit diagram of pixels in the image sensor.

FIG. 3 is a diagram of an equivalent circuit of the unit pixels 206 shown in FIG. 2. FIG. 3 shows the two unit pixels surrounded by a dashed line in FIG. 2, out of which the upper pixel does not have a well contact 207 and the lower pixel has a well contact 207.

In each of the unit pixels 206, a photodiode (PD) 301 converts the optical image formed by the imaging lens into a charge and stores the charge. The charge stored in the PD 301 is transferred to a floating diffusion unit (FD) 304 via a transmission switch 302 made up of a MOS transistor. When a selection switch 306 made up of a MOS transistor is turned ON, the charge that was transferred to the FD 304 is output, via an amplification MOS transistor 305 that forms a source follower amplifier, to a column output line 307 as a voltage that corresponds to the charge. Note that the selection switches 306 are controlled in units of rows, and the pixel signals in a selected row are output to the column output line 307 all at once.

A reset switch 303 made up of a MOS transistor resets the potential of the FD 304 to a power source potential VDD. Also, the reset switch 303 resets the potential of the PD 301 to the power source potential VDD via the transmission switch 302. The transmission switch 302, the reset switch 303, and the selection switch 306 are respectively controlled by control signals PTX, PRES, and PSEL via the signal lines connected to the vertical scanning circuit 202. The well contacts 207 are connected to GND and the well potential is fixed at the GND potential. Note that in the present embodiment, a configuration is employed in which the well contacts are connected to GND, but the well contacts may be connected to a voltage supply wire.

Figure 4A:
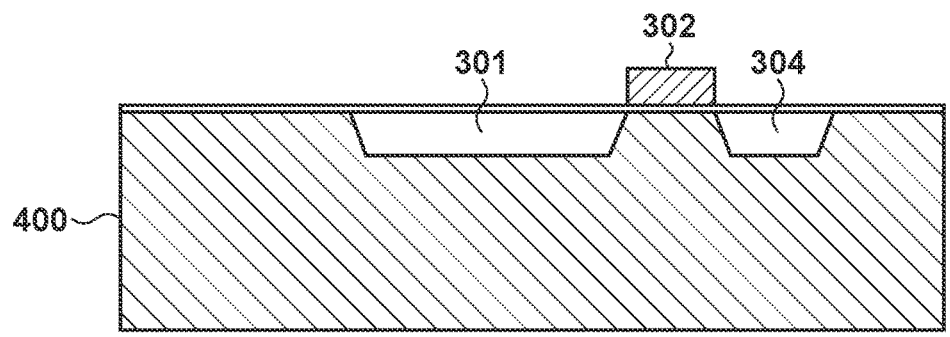
FIGS. 4A and 4B are side cross-sectional diagrams showing a configuration of an image sensor.
Figure 4B:
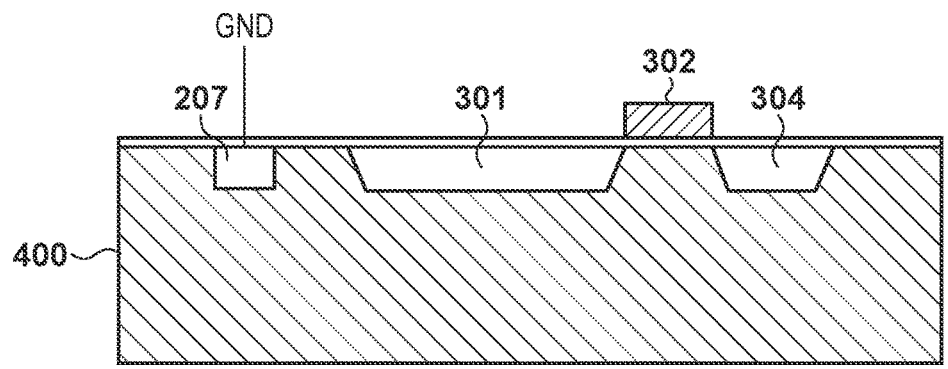

FIGS. 4A and 4B are respective schematic cross-sectional diagrams of the pixels shown in FIG. 3. FIG. 4A shows a pixel that does not have a well contact, and FIG. 4B shows a pixel that does have a well contact. As shown in FIGS. 4A and 4B, the PD 301 formed by an N-type impurity region is formed in a well 400 that is a p-type semiconductor layer. Also, the transmission switch 302 and the FD 304 are formed in the well 400. Furthermore, in FIG. 4B, a well contact 207 is formed, and the GND voltage is applied to the well contact 207.

By arranging the well contact 207 in this way, the well 400 is supplied with a reference voltage from GND and the distributing of the well potential in the pixel region can be suppressed, and therefore electrical shading that appears in the captured image can be mitigated. Furthermore, in the present embodiment, by changing the arrangement density of the well contacts according to the curved shape of the image sensor chip 101, dark current irregularity can also be suppressed.

As described above, in the present embodiment, in an image sensor chip that has a curved shape, the arrangement density of the well contacts in the image sensing plane is set differently depending on the region according to the curved shape of the image sensor chip. Accordingly, favorable optical characteristics with suppressed light shading and the like can be realized, and high image quality with suppressed dark current shading as well can be provided.

Note that the curved shape of the image sensor chip, the arrangement pattern of the well contacts, and the configuration of the image sensor described in the present embodiment are examples, and the present invention is not limited to these examples. For example, in the case where the entirety of an image sensor chip has been curved so as not to have a flat portion, a method may be used in which the arrangement density of well contacts in a region with low curvature is reduced according to the curvature of the image sensor chip. Also, the image sensor according to the present embodiment is a surface illuminated CMOS image sensor, but the image sensor is not limited to this, and the present invention is also applicable to a rear surface illuminated image sensor and an image sensor that has a photoelectric conversion film.

Second Embodiment

Figure 5:
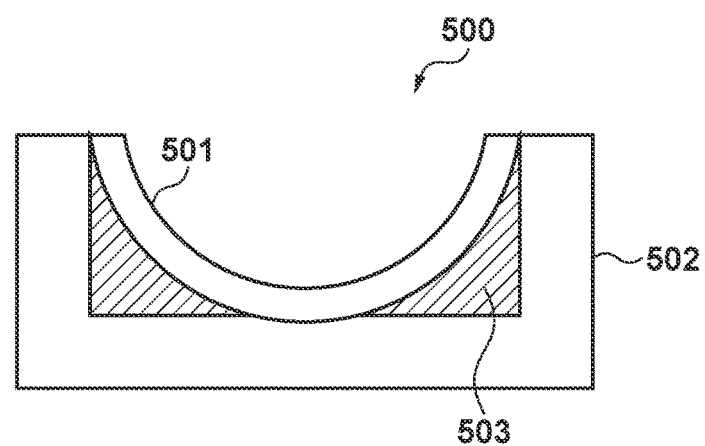
FIG. 5 is a schematic side cross-sectional diagram of an image sensor according to a second embodiment of the present invention.

FIG. 5 is a schematic side cross-sectional diagram of an image sensor according to a second embodiment of the present invention. An image sensor 500 is a CMOS image sensor, for example, in which an image sensor chip 501 that has an image sensing plane with a plurality of pixels that are two-dimensionally arranged thereon, is mounted onto a supporting substrate 502 that has a concave shape. As shown in FIG. 5, the image sensor chip 501 has a spherically curved shape. The space between the supporting substrate 502 and the image sensor chip 501 is filled with, for example, an adhesive layer 503 that supports the image sensor chip 501 so as to maintain the spherically curved shape thereof. As shown in FIG. 5, due to the image sensor chip 501 having a spherically curved shape, even in the peripheral region of the image sensing plane, light that has passed through the imaging lens is incident on the pixels in a state in which the direction of the light is nearly perpendicular to the image sensing plane. Thus, irregularity in the amount of light on the light receiving surface can be suppressed.

The image sensor chip that has a spherically curved shape can also be realized with a known technique as described in the first embodiment. The curvature of the entire image sensing plane is constant when a spherically curved shape is employed, but there are cases where stress on the image sensor chip 501 differs depending on the region. For example, in the case where an air hole is provided at a position that corresponds to the center of the image sensor chip 501 in the supporting substrate 502 and air is discharged from the air hole, there are cases where the stress on the central region is greater than the stress on the peripheral region. In such a case, the image sensing plane will have a characteristic in which dark current is lowest at the center of the image sensor chip and dark current increases in the peripheral region as the distance from the central region increases.

Figure 6:
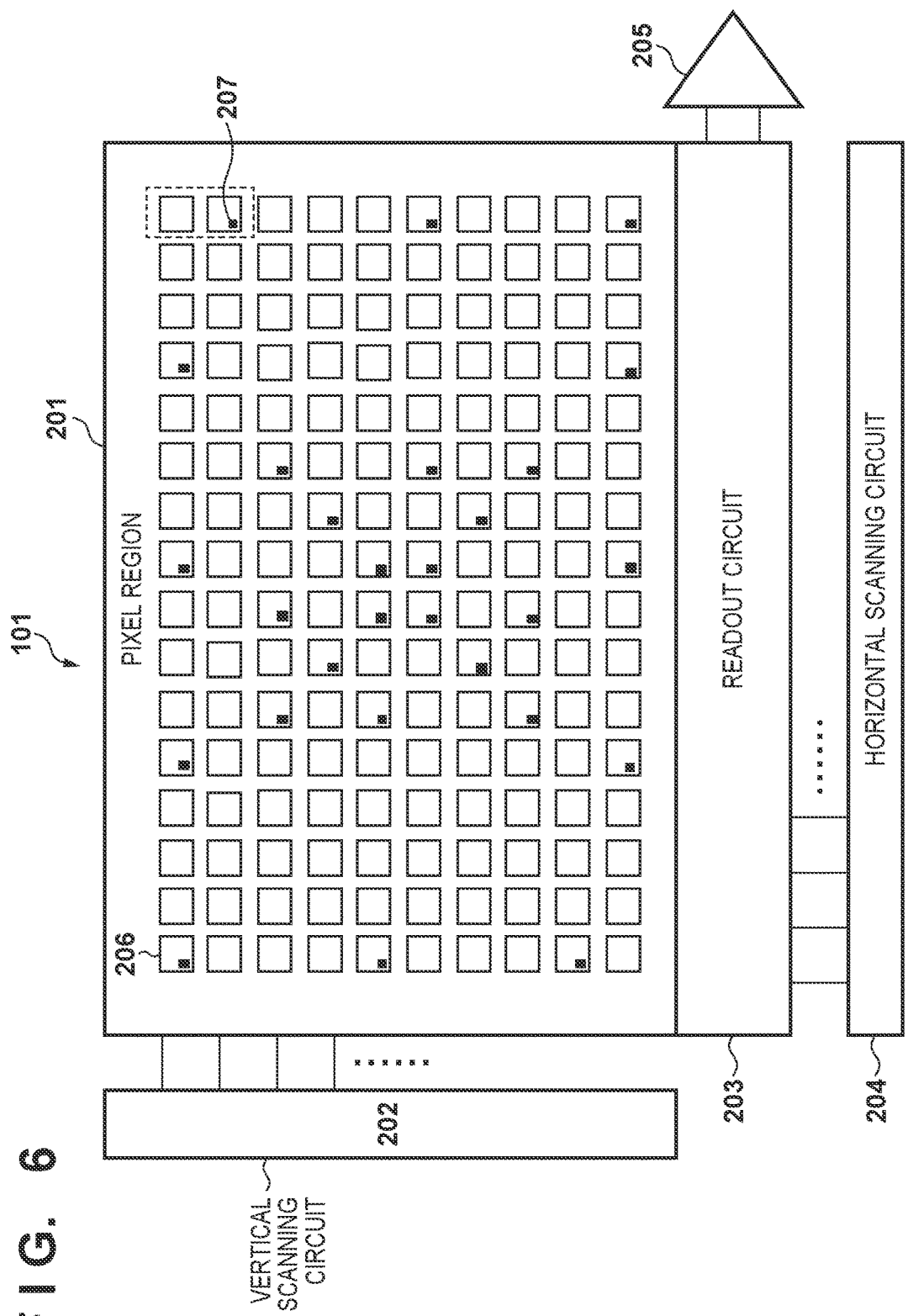
FIG. 6 is a block diagram showing an electrical configuration of the image sensor according to the second embodiment.

FIG. 6 is a block diagram showing the electrical configuration of the image sensor chip 501 shown in FIG. 5. The reference signs 201 to 207 in FIG. 6 indicate the same configurations as those in FIG. 2 described for the first embodiment, and therefore their description has been omitted. In FIG. 6, the well contacts 207 are arranged with a high density in the central region of the image sensing plane subjected to high stress, and the well contacts 207 are arranged with a low density in the peripheral region subjected to little stress. In the image sensor chip 501 that has a spherically curved shape as shown in FIG. 5, by arranging the well contacts such that the arrangement density thereof is different in each region according to stress as is shown in FIG. 6, dark current irregularity can be suppressed.

Figure 7:
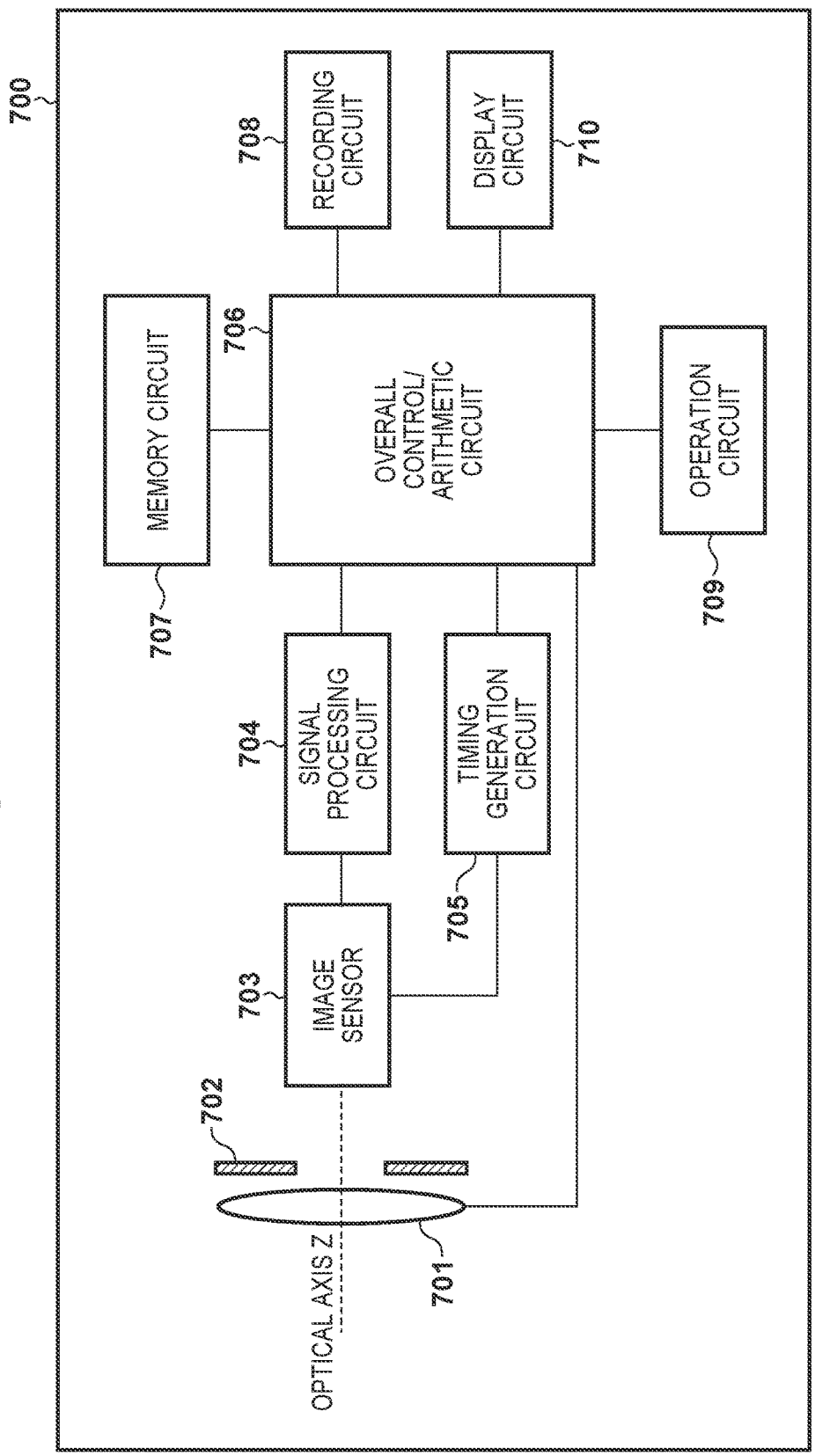
FIG. 7 is a block diagram showing a configuration of an image capturing apparatus.

FIG. 7 is a block diagram showing an example of the configuration of an image capturing apparatus 700 that uses the image sensor described in the first or second embodiment. In FIG. 7, the image capturing apparatus 700 has an imaging lens 701, a lens diaphragm 702, and an image sensor 703 corresponding to either of the image sensors 100 and 500 described in the first and second embodiments. Light from the subject image that has passed through the imaging lens 701 is formed into an image in the vicinity of the focal position of the imaging lens 701. The image sensor 703 is a CMOS image sensor, for example, in which photoelectric conversion is performed on the subject image formed on the imaging lens 701.

Also, a signal processing circuit 704 performs digital processing including signal amplification, various types of correction such as reference level adjustment, data sorting, and the like on image signals output from the image sensor 703. A timing generation circuit 705 outputs a drive timing signal to the image sensor 703 and the like. An overall control/arithmetic circuit 706 performs overall driving and control for the entire image capturing apparatus, including the image sensor 703 and the signal processing circuit 704. The overall control/arithmetic circuit 706 also performs predetermined pixel processing, defect correction, and the like on the image signals output from the signal processing circuit 704.

A memory circuit 707 and a recording circuit 708 record and store image signals and the like output from the signal processing circuit 704 to a non-volatile memory, a memory card, or the like. An operation circuit 709 accepts signals from operation members included in the image capturing apparatus 700, and reflects user commands in the overall control/arithmetic circuit 706. A display circuit 710 displays a captured image, live view images, various types of setting screens, and the like.

As described above in the first and second embodiments, in an image sensor chip that has a curved shape, the well contacts are arranged such that the arrangement density thereof is different in each region according to the curved shape. Accordingly, favorable optical characteristics with suppressed light shading and the like can be realized, and also high image quality with suppressed dark current shading as well can be provided.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-076311, filed Apr. 2, 2015, which is hereby incorporated by reference herein in its entirety.

What is claimed is:

1. An image sensor comprising:
an image sensing plane in which a plurality of pixels are two-dimensionally arranged at an equal pitch and at least a portion of a region thereof has a curved shape; and
a plurality of well contacts that are connected to a portion of pixels from among the plurality of pixels and fix a well potential,
wherein the plurality of well contacts are arranged such that an arrangement density thereof in the image sensing plane is different in each region according to the curved shape of the image sensing plane.

2. The image sensor according to claim 1, wherein the plurality of well contacts are arranged such that the arrangement density thereof in the image sensing plane is different in each region according to a curvature of the image sensing plane.

3. The image sensor according to claim 1, wherein the plurality of well contacts are arranged such that the arrangement density thereof in the image sensing plane is lower in a region of the image sensing plane with low curvature.

4. The image sensor according to claim 1, wherein the plurality of well contacts are arranged such that the arrangement density thereof in the image sensing plane is different in each region according to stress in respective regions of the curved shape of the image sensing plane.

5. The image sensor according to claim 4, wherein the plurality of well contacts are arranged such that the arrangement density thereof in the image sensing plane is lower in a region with little stress due to the curved shape of the image sensing plane.

6. The image sensor according to claim 1, wherein the plurality of well contacts are arranged such that the arrangement density thereof in the image sensing plane is different in each region according to stress in the regions of the image sensing plane.

7. The image sensor according to claim 6, wherein the plurality of well contacts are arranged such that the arrangement density thereof in the image sensing plane is lower in a region of the image sensing plane with little stress.

8. The image sensor according to claim 1, wherein the plurality of well contacts are connected to ground.

9. An image capturing apparatus comprising:
an image sensor including:
an image sensing plane in which a plurality of pixels are two-dimensionally arranged at an equal pitch and at least a portion of a region thereof has a curved shape; and
a plurality of well contacts that are connected to a portion of pixels from among the plurality of pixels and fix a well potential,
wherein the plurality of well contacts are arranged such that an arrangement density thereof in the image sensing plane is different in each region according to the curved shape of the image sensing plane.

* * * * *